United States Patent [19]
Shinohara et al.

[11] Patent Number: 5,711,824
[45] Date of Patent: Jan. 27, 1998

[54] SOLAR CELL

[75] Inventors: Hisato Shinohara; Hisao Morooka; Izumi Ikeo, all of Yamanashi; Akemi Takenouchi, Kanagawa; Setsuo Nakajima, Kanagawa; Yasuyuki Arai, Kanagawa, all of Japan

[73] Assignees: Semiconductor Energy Laboratory Co., Ltd., Kanagawa-ken; TDK Corporation, Tokyo, both of Japan

[21] Appl. No.: 579,481

[22] Filed: Dec. 27, 1995

[30] Foreign Application Priority Data

| Jan. 9, 1995 | [JP] | Japan | 7-017549 |
| Jun. 19, 1995 | [JP] | Japan | 7-176731 |
| Sep. 5, 1995 | [JP] | Japan | 7-252004 |

[51] Int. Cl.$^6$ ............................................. H01L 31/04
[52] U.S. Cl. ............ 136/259; 136/256; 257/436; 204/192.14; 204/192.27; 437/2; 437/187; 437/189; 437/194; 437/199
[58] Field of Search ............................ 136/259, 256; 257/436; 437/2–5, 187, 189, 194, 199; 204/192.17, 192.27, 192.14

[56] References Cited

U.S. PATENT DOCUMENTS 5,101,260  3/1992  Nath et al. .................... 257/53
5,486,238  1/1996  Nakagawa et al. ............ 136/259

FOREIGN PATENT DOCUMENTS 6-61514    3/1984   Japan.
60-257183  12/1985  Japan ..................... 136/259
62-203369  9/1987   Japan.

OTHER PUBLICATIONS

Meeting on Japanese Applied Physics, abstract No. 30a–G–12 (Mar. 30, 1995).
16th International conference on Amorphous Semiconductors (ICAS), abstract No. Mo–Po4–2 (Sep. 3, 1995).

Primary Examiner—Aaron Weisstuch
Attorney, Agent, or Firm—Sixbey, Friedman, Leedom & Ferguson; Gerald J. Ferguson, Jr.; Jeffrey L. Costellia

[57] ABSTRACT

An aluminum film is formed as a photoreflective electrode at the side opposite to the light incident side of a solar cell by sputtering at a substrate temperature of 50° to 200° C. using a target of aluminum containing silicon as an impurity element at 0.1 to 6.0 weight %. An aluminum film or a silver film in which an impurity element is not added is formed on the above aluminum film, to obtain a texture structure having convex and concave shapes. When an organic resin film substrate is used, components (released as a gas by heating in a vacuum atmosphere) such as water within the organic resin film are removed after the aluminum film is formed.

8 Claims, 19 Drawing Sheets

FIG.13A  FIG.13B
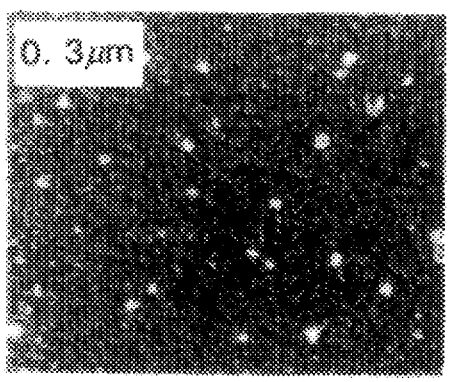
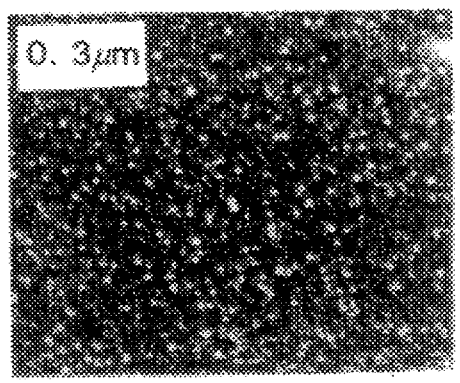
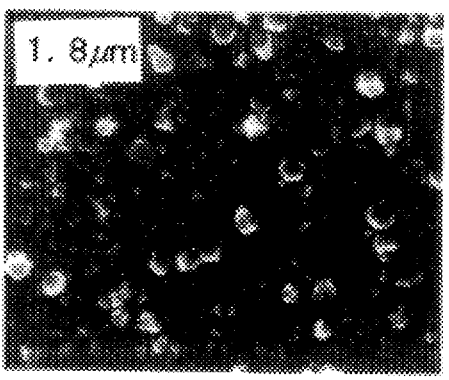
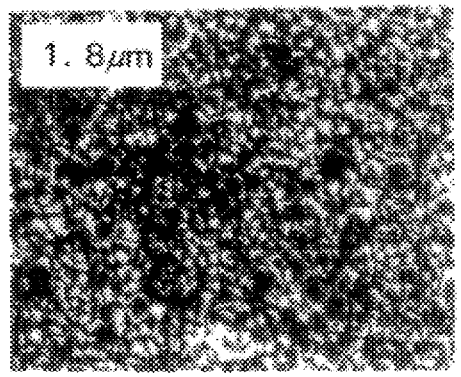
pure Al　　　Al-Si 0.5wt%
70 °C FIG. 14A
FIG. 14B
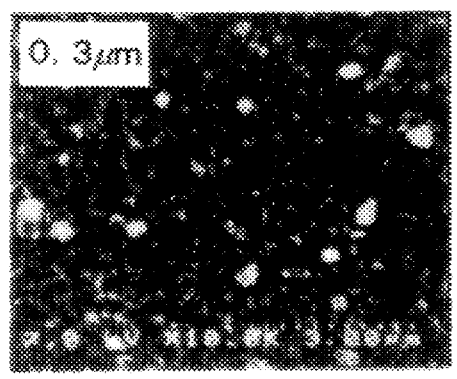
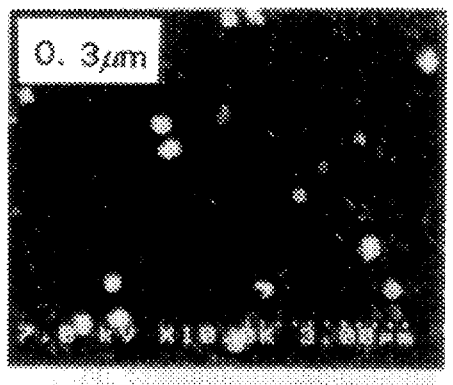
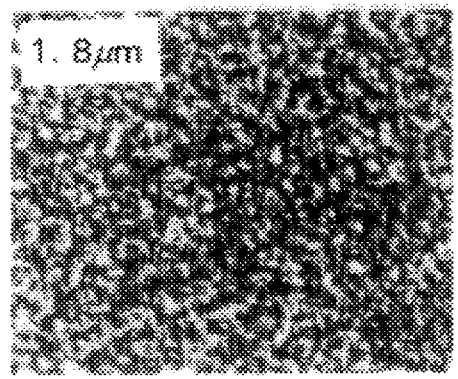
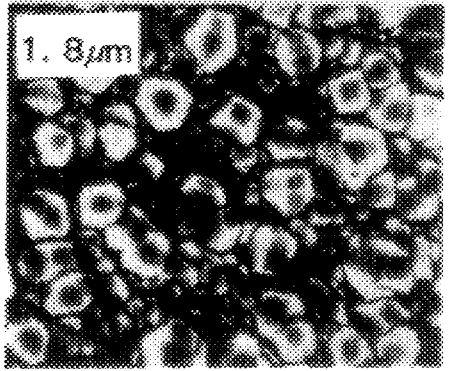
pure Al
Al - Si 0.5wt%
150 °C

|  | Conventional Solar Cell | Solar Cell of Embodiment | Difference (%) |
|---|---|---|---|
| Photoelectric Conversion Efficiency (%) | 7.5 | 8.1 | + 8 |
| Short Circuit Current (A) | 15.1 | 16.8 | + 11 |
| Open circuit voltage (V) | 0.84 | 0.83 | - 1 |
| Fill Factor | 0.584 | 0.583 | - 0.2 |

FIG.20

SOLAR CELL

BACKGROUND OF THE INVENTION

The present invention relates to a solar battery in which a photoelectric conversion layer for generating a photovoltage is formed by using an amorphous or microcrystalline silicon thin film. Also, the present invention relates to a photoreflective electrode of a solar cell having a texture structure. Further, the present invention relates to a photoreflective electrode of a solar cell using an organic resin film as a substrate.

A solar cell having a photoelectric conversion layer in which at least one PIN junction is formed using a amorphous or microcrystalline silicon film is known. In such the solar cell, light which is incident on the solar cell and transmits without being absorbed in a photoelectric conversion layer is reflected by a photoreflective electrode provided at the side opposite the light incident side and then is incident on the photoelectric conversion layer again, so that light absorption in the photoelectric conversion layer is promoted by the photoreflective electrode.

The photoreflective electrode is formed by a single layer film (aluminum (Al) or silver (Ag)), a laminated layer composed of a transparent conductive film (such as indium tin oxide (ITO) alloy, zinc oxide (ZnO), and tin oxide (SnO2)) or a metal film (such as titanium (Ti), chromium (Cr), nickel (Ni) and stainless steel) and aluminum or silver film.

The photoreflective electrode may have an uneven surface (so called texture structure) formed by aligning crystals of the metal material in a desired direction. Light which is incident on the photoelectric conversion layer and reaches the photoreflective electrode without being absorbed in the photoelectric conversion layer is scattered and reflected in various directions, so that the light is incident on the photoelectric conversion layer. By this, improvement of light absorbing efficiency is obtained.

When an aluminum film is used as a photoreflective electrode, an aluminum film having a purity of 99.99% is conventionally formed on a glass substrate or an organic resin film substrate by sputtering. However, only an aluminum film having an essentially even surface can be obtained by this method.

With an uneven aluminum film, since the integrated reflection (total amount of reflected light) includes specular or mirror (directional) reflection (the angle of reflected light is the same as the angle of incident light), it cannot be expected to utilize light effectively. Particularly, the long wavelength component of the incident light cannot be sufficiently utilized.

Texture structure may be attempted by crystal growth of the aluminum film along a desired direction. When aluminum is used as a photoreflective electrode and the aluminum film is formed by sputtering while heating a substrate, crystallization of aluminum is promoted and crystal grains are generated to obtain a surface having an uneven shape. However, since the size and shape of the generated crystal grains is large or nonuniform, it is not effective to improve photoelectric conversion efficiency. Also, film quality is nonuniform.

In the formed aluminum film, large and abnormal crystal grains having a diameter of about 1 μm may be grown. By generation of the crystal grains, a short circuit may be caused between the upper electrode (light incident side electrode) and the photoreflective electrode. FIG. 5 shows a SEM photograph representing a state wherein large and abnormal crystal grains are generated in an aluminum film formed by a conventional method.

When an aluminum film is formed on an organic resin film substrate by sputtering, since the film quality is reduced, good film quality cannot be obtained and reflectivity of the photoreflective electrode is decreased and electric resistance is increased. As a result, a solar cell having high performance cannot be obtained.

SUMMARY OF THE INVENTION

To solve the above problems, an object of the present invention is to obtain a solar cell having high performance by increasing the photocurrent (current produced by photovoltage) of the solar cell, obtaining a fine and uniform texture structure, and effectively utilizing the long wavelength component of the incident light, with an aluminum film constituting a photoreflective electrode of the solar cell formed on a flexible organic resin film substrate.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0 weight %.

According to the present invention, there is provided a solar cell having a substrate, a photoreflective electrode, a photoelectric conversion layer, and a transparent electrode, wherein the photoreflective electrode includes a first aluminum film containing at least one of silicon, nickel, and copper as an impurity element at 0.1 to 6.0 weight %, and a second aluminum film formed on the first aluminum film and having a substantially no impurity element.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0 weight % and a silver film formed on the aluminum film and having substantially no impurity element.

According to the present invention, there is provided a solar cell having a substrate, a photoreflective electrode, a photoelectric conversion layer, and a transparent electrode, wherein the photoreflective electrode includes a first aluminum film containing at least one of silicon, nickel, and copper as an impurity element at 0.1 to 6.0 weight % and a second aluminum film formed on the first aluminum film and having substantially no impurity element, wherein the first aluminum film has an average surface roughness of 50 nm or more.

According to the present invention, there is provided a solar cell having a substrate, a photoreflective electrode, a photoelectric conversion layer, and a transparent electrode, wherein the photoreflective electrode includes an aluminum film containing at least one of silicon, nickel, and copper as an impurity element at 0.1 to 6.0% and a silver film formed on the aluminum film and having substantially no impurity element, and the aluminum film has an average surface roughness of 50 nm or more.

In the photoreflective electrode, silicon is preferably used as the impurity element. Glass, metal, or an organic resin film may be used as a substrate. As the material of the organic resin film, polyethyleneterephthalate, polyethylenenaphthalate, polyestersulphone, polyimide, or aramid can be used.

According to the present invention, there is provided a method of producing an electrode for a solar cell comprising the step of forming an aluminum film on a substrate at a substrate temperature of 50° to 200° C. by sputtering using aluminum containing at least one of silicon, nickel, and copper at 0.1 to 6.0 weight % as a target.

According to the present invention, there is provided a method for producing an electrode for a solar cell comprising the steps of: forming a first aluminum film having an uneven surface on a substrate at a substrate temperature of 50° to 200° C. by sputtering using aluminum containing at least one of silicon, nickel, and copper at 0.1 to 6.0 weight % as a target; and forming one of a second aluminum film and a silver film on the first aluminum film, wherein the second aluminum film or silver film has substantially no impurity element.

In the solar cell electrode producing method, silicon is preferably used as the impurity element. Glass, metal, or an organic resin film may be used as a substrate. As the material of the organic resin film, polyethyleneterephthalate, polyethylenenaphthalate, polyestersulphone, polyimide, or aramid can be used.

According to the present invention, there is provided a method for producing an electrode for a solar cell comprising the steps of: heating an organic resin film substrate to release gas from the substrate; and forming an aluminum film on the substrate at a substrate temperature of 50° to 200° C. by sputtering after the heating step.

DC sputtering or RF sputtering can be used.

According to the present invention, there is provided a method for producing an electrode for a solar cell comprising the steps of: heating an organic resin film substrate to release gas from the substrate; and forming an aluminum film on the substrate at a substrate temperature of 50° to 200° C. by sputtering using as a target, aluminum containing at least one of silicon, nickel, and copper as an impurity element at 0.1 to 6.0 weight %, after the heating step.

In the above method, silicon is preferably used as the impurity element.

The inventors have found that, by forming an aluminum film on the substrate at a substrate temperature of 50° to 200° C., preferably 70° to 150° C. by sputtering using as a target, aluminum containing, for example, silicon as an impurity element at 0.1 to 6.0 weight %, preferably 0.5 to 2.0 weight %, an aluminum film having an uneven surface suitable as a photoreflective electrode of a solar cell is obtained.

The content of the impurity element in the aluminum film is 0.1 to 6.0 preferably 0.1 to 2.0 weight %, further preferably 0.1 to 1.0 weight % (by Auger electron spectroscopy method). When the content of the impurity element in the aluminum film is 1.0% or less, the diffuse reflectance (integrated reflectance–mirror (directional) reflectance) of the aluminum film becomes high.

FIG. 12 shows the relationship between the content of silicon as the impurity element in the aluminum film and the diffuse reflectance (the wavelength of incident light is 650 nm as a standard value) of an aluminum film, wherein the content of silicon in an aluminum target is 0.5 weight %, 1.0 weight %, and 2.0 weight % and the substrate temperature is 150° C. during sputtering.

When the contents of the impurity element in a target are 0.5 weight %, 1.0 weight %, and 2.0 weight %, the contents of the impurity element in the formed aluminum film are 0.2 to 0.4% (typically 0.3%), 0.3 to 1.0% (typically 0.7%), and 0.6 to 1.5% (typically 1.0%), respectively.

Increasing the thickness of the aluminum film tends to enlarge the crystal grains, thereby forming an uneven surface and increasing diffuse reflectance. (See FIG. 16)

As the impurity element, silicon (Si) is preferred. When nickel (Ni), copper (Cu), or the like is used, the same effect is obtained. A preferable result is obtained by using DC sputtering and RF sputtering.

In the aluminum film, free crystal grains having homogeneity are formed. The average size (diameter) of the crystal grains is several 100 to several 1000 Å. The crystal grains form a convex portion of a texture structure in a photoreflective electrode of a solar cell, and a size and shape thereof suitable to reflect an incident light (particularly, a long wavelength light) can be obtained.

Thus, according to the present invention, an aluminum film which has a fine texture structure and is superior as a photoreflective electrode of a solar cell can be formed. In the solar cell in which the aluminum film having the fine texture structure is used as a photoreflective electrode, the photocurrent can be increased and photoelectric conversion efficiency can be significantly improved in comparison with a case wherein a conventional aluminum film having an even surface is used. Also, since abnormal and large growth of the crystal grains can be prevented, occurrence of short circuits between the lower electrode and the transparent electrode of the solar cell can be prevented.

The number of convex and concave portions of the photoreflective electrode is increased as film thickness of the aluminum film is increased, and thus the grain size (particle diameter) of aluminum forming the convex and concave portions is enlarged. The conversion efficiency of the solar cell is increased by the convex and concave portions of the photoreflective electrode. However, if the convex and concave portions become large, the open circuit voltage or the like of the solar cell is reduced.

The influence of convex and concave shapes of the photoreflective electrode on the characteristics of the solar cell is explained using data shown in FIG. 8. FIG. 8 shows the photocurrent (a short circuit current) and open circuit voltage of a solar cell (AM1.5, 100 mW/cm$^2$) produced by using a photoreflective electrode in which the average roughness (measurement by JIS B0601 Rz (10 point average roughness)) of the surface is varied. In FIG. 8, the short circuit current increases as the convex and concave portions become large. This is because light absorbed in the photoelectric conversion layer is increased mainly by a light limitation effect due to the texture structure.

The open circuit voltage is reduced from a point where the surface roughness (size of convex and concave portions) is about 30 nm. It is considered that the reduction of the open circuit voltage is caused by the nonuniformity of the junction of the photoelectric conversion layer. The photoelectric conversion layer formed on the photoreflective electrode having an uneven surface (convex and concave portions) has a PIN junction structure. The thin P-type or an N-type layer has a surface roughness of 10 to 30 nm, and the I-type layer has a surface roughness of 300 to 500 nm. When a base film has convex and concave shapes, the film thickness of a photoelectric conversion layer formed on the base film is nonuniform due to influence of the convex and concave shapes of the base film. If the average roughness of an uneven surface is equal to or larger than the thickness of the P-type or an N-type layer constituting the photoelectric conversion layer, this influence cannot be ignored, and reduction of the open circuit voltage may result.

Thus, when the convex and concave portions of an aluminum film constituting a photoreflective electrode are made large, the photocurrent is increased by a light limitation effect. However, since the open circuit voltage is reduced, conversion efficiency cannot be improved sufficiently. In certain cases, conversion efficiency is further reduced by providing the convex and concave portions, so that an enhancement effect due to texture structure cannot be obtained.

For such a problem, in the present invention, an aluminum film or a silver film which contains substantially no impurity element (the content of impurity element is less than 0.1% and the impurity element is not added intentionally) and used as a photoreflective electrode of a solar cell is formed on an aluminum film which has an uneven surface and contains silicon as an impurity element at 0.1 to 6.0 weight %, preferably 0.5 to 2.0 weight %.

As a result, influence due to convex and concave shapes of an aluminum layer having an uneven surface can be decreased by using an aluminum film or a silver film containing substantially no impurity element. As a result, the open circuit voltage of a solar cell can be increased and conversion efficiency can be improved.

In producing the photoreflective electrode, aluminum containing silicon atoms as an impurity element at 0.1 to 6.0 weight %, preferably 0.5 to 2.0 weight % is used as a target, and the substrate temperature during sputtering is 50° to 200° C., preferably 70° to 150° C. Thus, an aluminum film which has an uneven surface and contains an impurity element such as silicon is formed on the substrate by sputtering. Further, an aluminum film or a silver film is formed on the aluminum film having an uneven surface by using a target, aluminum or silver containing substantially no impurity element.

Therefore, by forming the aluminum film or the silver film containing substantially no impurity element on the aluminum film which has a sharp and uneven surface and contains silicon atoms, a photoreflective electrode of a solar cell which has a fine and uneven surface and no sharp or large uneven surface can be formed.

In the solar cell having the photoreflective electrode in which the aluminum film or the silver film containing substantially no impurity element is formed on the aluminum film having an uneven surface, the short circuit current and open circuit voltage are increased and thus the photoelectric conversion efficiency can be significantly improved in comparison with a solar cell having a conventional uneven surface.

When an organic resin film substrate is used as a substrate on which the aluminum film constituting the photoreflective electrode is formed, gas removal treatment is performed by heating the organic resin film, preferably in a vacuum atmosphere at $10^{-1}$ pa or lower, before the aluminum film is formed on the organic resin film. By heating in a vacuum atmosphere in this gas removing treatment, components released as a gas, such as water, which are contained in the organic resin film are removed. Thus, a fine aluminum film is formed on the organic resin film in comparison with a case wherein the above gas removal treatment is not performed.

Polyethyleneterephthalate (PET), polyethlenanaphthalate (PEN), polyestersulphone (PES), polyimide, or aramid can be used as the organic resin film substrate. In particular, when a polyethylenenaphthalate (PEN) substrate is used as the organic resin film, the gas removal treatment for the organic resin film substrate is performed by heating at 130° to 200° C., preferably 140° to 180° C., further preferably about 150° C. Further preferably, the gas removal treatment for the organic resin film substrate is performed in a vacuum atmosphere ($1\times10^{-1}$ pa or lower).

Then, by forming an aluminum film by sputtering while heating, a fine aluminum film having uniform film quality can be obtained. The aluminum film is formed on the organic resin film substrate on which the gas removal treatment is performed, by sputtering using aluminum containing an impurity element as a target while heating, so that an aluminum film which has fine, uniform film quality, an uneven surface (convex and concave portions) suitable for a photoreflective electrode of a solar cell, and a texture structure can be obtained in comparison with a case wherein the gas removal treatment is not performed.

It is effective to decrease (blunt) the convex and concave shapes by forming an aluminum film or a silver film containing no impurity element on the aluminum film.

When sputtering is performed on the organic resin film substrate while heating, since a gas containing hydrogen, oxygen, or nitrogen is released from the substrate during sputtering by the heating in a vacuum atmosphere, adhesion of aluminum atoms to the substrate is blocked. Thus, in comparison with a substrate in which a gas is not released, aluminum is adhered sufficiently, so that an aluminum film having a low density is formed.

According to the present invention, by performing the gas removal treatment of an organic resin film in advance, release of a gas from a substrate during sputtering is prevented, so that a fine aluminum film having uniform film quality can be formed. If the substrate temperature is increased in the gas removal treatment, the gas removal treatment time is shortened.

It has been confirmed by the inventors that a fine aluminum film having a grain size (diameter) of several 100 Å to several 1000 Å, uniform film quality, and a texture structure can be obtained by forming an aluminum film on an organic resin film substrate on which the gas removal treatment is performed, by RF sputtering using as a target, pure aluminum (99.99%) containing no impurity element at a substrate temperature of 50° to 200° C., preferably 70° to 150° C.

BRIEF DESCRIPTION OF THE DRAWINGS

FIGS. 13A and 13B show surface SEM photographs of an aluminum film;

FIGS. 14A and 14B show surface SEM photographs of an aluminum film;

FIG. 20 shows a comparison of the characteristics of the solar cells of the embodiment and a conventional solar cell.

DETAILED DESCRIPTION OF THE PREFERRED EMBODIMENTS

Embodiment 1

This embodiment shows an example of a thin film solar cell using as a photoreflective electrode an aluminum film which has a texture structure and is formed on a flexible organic resin film substrate.

A Polyethylenenaphthalate (PEN) film is used as the organic resin film substrate. The aluminum film is formed by a roll-to-roll type DC magnetron sputter apparatus. A polyethyleneterephthalate (PET), polyestersulphone (PES), polyimide, or aramid can be used as the organic resin film substrate. RF sputtering may also be performed.

Figure 1:
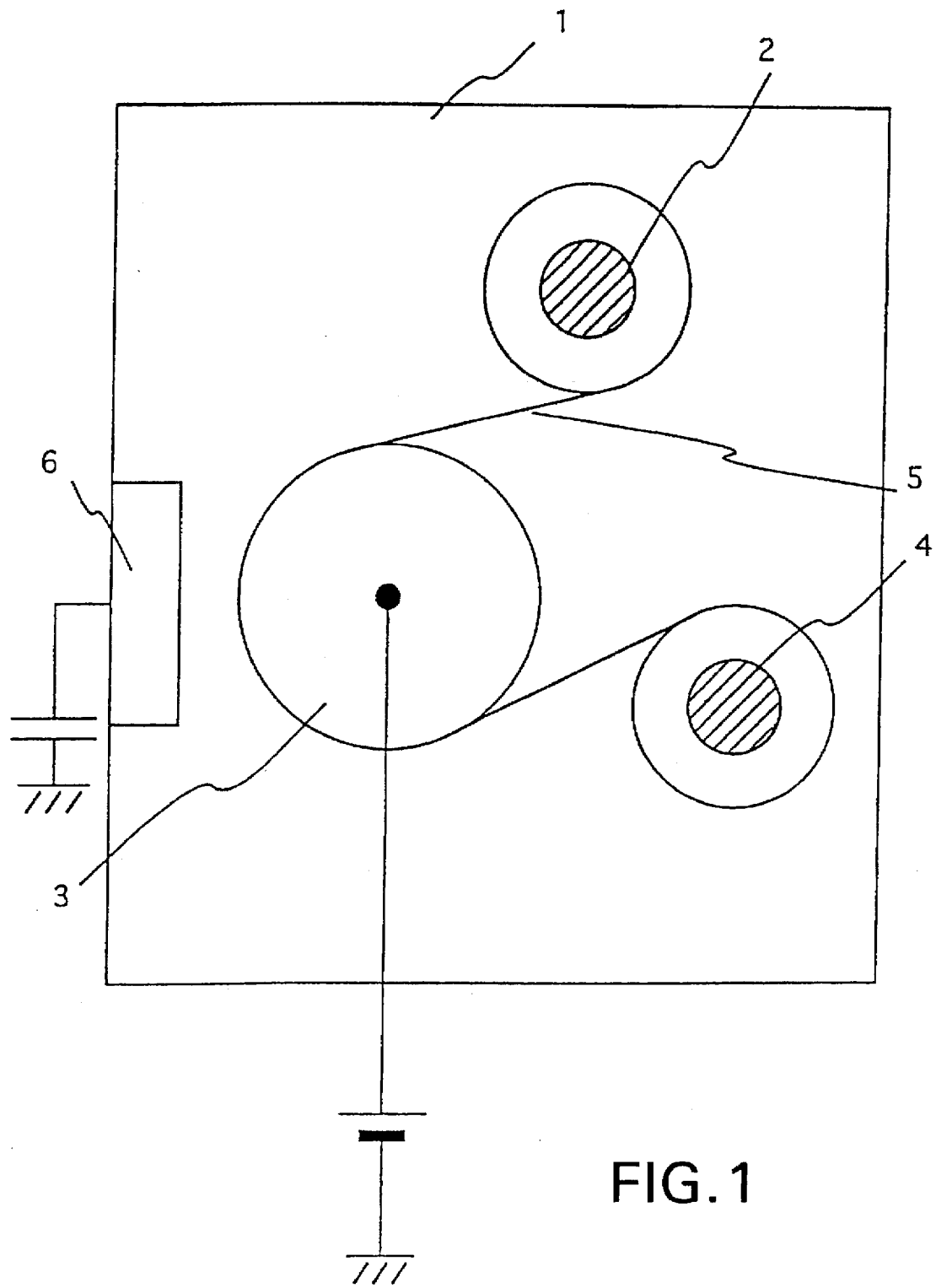
FIG. 1 shows a roll to roll type magnetron DC sputtering apparatus used in Embodiment 1.
Figure 2:
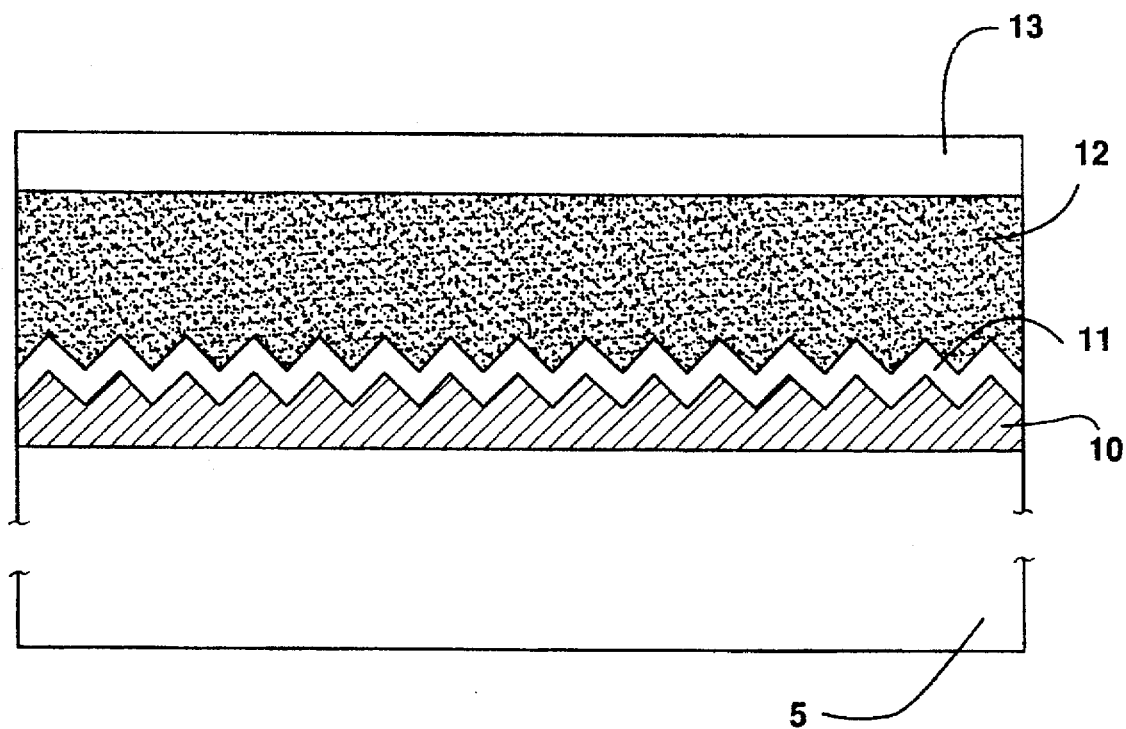
FIG. 2 shows a solar cell in which an aluminum film having a texture structure is used as a photoreflective electrode in Embodiment 1.

FIG. 1 shows a roll-to-roll type DC magnetron sputtering apparatus used in Embodiment 1. FIG. 2 shows a solar cell in which an alumina film having a texture structure is used as a photoreflective electrode in Embodiment 1.

Gas removal treatment is performed to remove gases absorbed in the organic resin film.

In a chamber 1 in the apparatus of FIG. 1, a PEN film (having a thickness of 50 to 150 μm, 75 μm in the embodiment) roll used as a flexible organic resin film substrate 5 is placed on feed and supply and take up rolls 2,4 over a drum 3, so that it is held in tension. The organic resin film substrate 5 can be transferred by drive motors (not shown) provided in the supply roll 2, the drum 3 and the takeup roll 4. The chamber 1 is exhausted by a rotary pump and a cryopump (they are not shown) to a vacuum of $1\times10^{-1}$ pa or lower, $1\times10^{-3}$ pa in the embodiment.

The temperature of the drum 3 is controlled by a heating apparatus (not shown) such as a metal mold temperature regulator, so that the entire organic resin film is heated by rotating the drum 3. The substrate temperature of the organic resin film substrate 5 is 130° to 200° C., preferably 140° to 180° C., further preferably about 150° C. The transfer speed of the substrate is controlled so as to maintain the above substrate temperature of the organic resin film substrate 5 for few minutes, preferably 5 minutes or longer, so that gas removal treatment is performed.

After the gas removal treatment of the organic resin film substrate 5, the chamber 1 is exhausted again to about $1\times10^{-5}$ pa to obtain a vacuum state. A plasma discharge is then produced by using an aluminum target 6 to which silicon atoms are added at 1.0 weight %, and then the film substrate 5 is transported by the drum 3, so that DC sputtering is performed. Nickel or copper may be also used as an impurity element added to the aluminum target. The target is cooled by supplying cooling water from the rear side.

Presputtering (precoating) is performed for about 30 minutes. The applied power is 0.8 kW. The sputtering gas is Argon (Ar) and is introduced into the chamber at 100 sccm. The sputtering pressure is set to be 0.5 pa.

By temperature control of the drum 3, the substrate temperature of the organic resin film substrate 5 is 50° to 180° C., preferably 70° to 150° C., 150° C. in the embodiment. The film formation speed is 700 to 7000 Å/minute, 700 Å in the embodiment. A film having a thickness of 2000 to 20000 Å, 2800 Å in the embodiment, is formed.

An example of the formation conditions of the aluminum film is as follows:

| | |
|---|---|
| Target-Substrate Distance | 85 mm |
| Target Size | 5 × 5 inch |
| Sputtering Pressure | 0.5 pa |
| Sputtering Gas | Argon at 100 sccm |
| Applied Power Density | 1.6 to 10.8 × $10^{-2}$ W/cm$^2$ |
| Target | Al (Si doped at 0 to 2 weight %) |
| Film Prebake | at 150° C. for 6 minutes |
| Substrate Temperature | 70 to 150° C. |

The formed aluminum film 10 has a fine texture structure. The average grain size (diameter) of crystals constituting a convex portion is several 100 Å to several 1000 Å. The content of the impurity element in the formed aluminum film is 0.9 weight % by Auger electron spectroscopy method. The average roughness of the surface of the formed aluminum film is 60 nm (measurement by JIS B0601 Rz (10 point average roughness).

Figure 6:
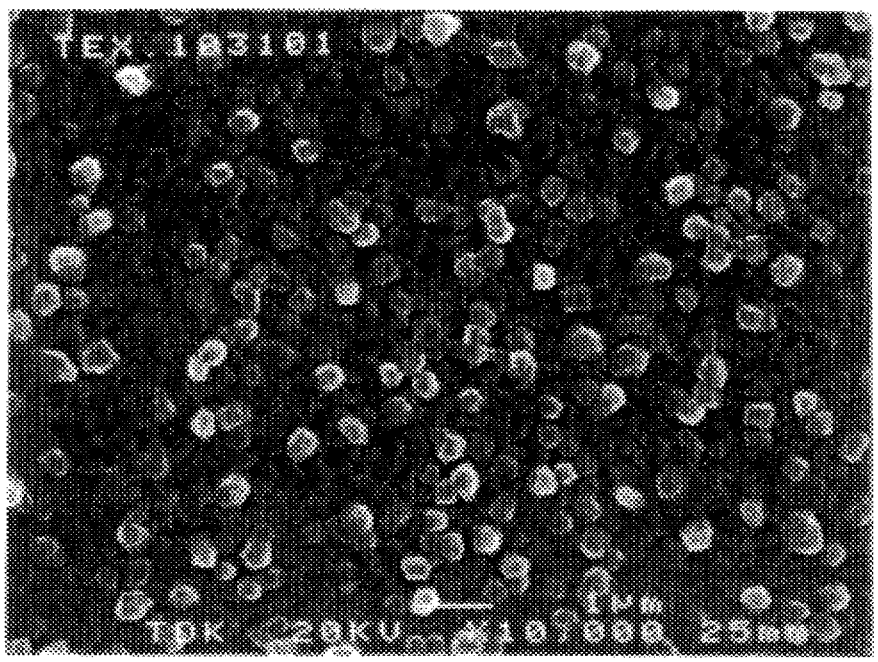
FIG. 6 shows a SEM photograph representing the state of the surface of the aluminum film formed by Embodiment 1.

FIG. 6 shows a SEM photograph representing the state of the surface of the aluminum film formed in Embodiment 1. A large and abnormal grown crystal is not observed.

For comparison, in the cases wherein the temperature of the organic resin film substrate 5 is 70° C. and 150° C., the thickness of the formed aluminum film and the view of the crystal growth are represented below.

FIGS. 13A and 13B show surface SEM photographs of a film formed by using an aluminum target in which silicon atoms are added at 0.5 weight % and a film formed by using an aluminum target in which silicon atoms are not added, wherein the temperature of the organic resin film substrate 5 is 70° C. FIGS. 14A and 14B show surface SEM photographs of a film formed by using an aluminum target in which silicon atoms are added at 0.5 weight % and a film formed by using an aluminum target in which silicon atoms are not added, wherein the temperature of the organic resin film substrate 5 is 150° C.

In FIGS. 14A to 15B, crystals having a large grain size are obtained as the substrate temperature is increased, and crystals having a large grain size are also obtained as the film thickness is increased. When the silicon atoms are added, crystals having the same grain size are grown uniformly.

Thus, an aluminum film having a fine texture structure can be formed on the flexible organic resin film substrate 5. The grain sizes of the crystals constituting the texture structure become large as the thickness of the aluminum film is increased.

Figure 7:
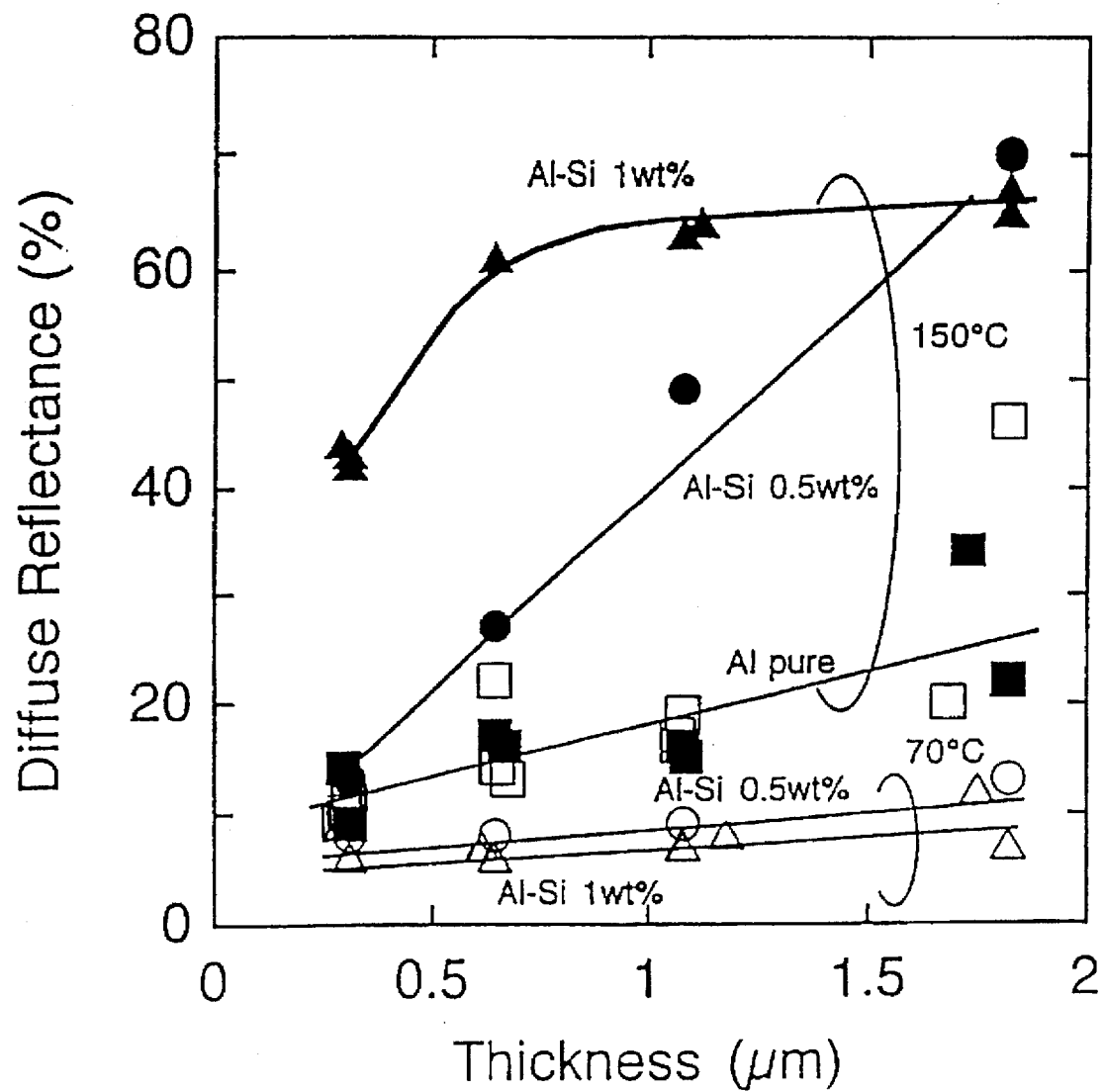
FIG. 7 shows the diffuse reflectance (wavelength of incident light is 650 nm, standard value) as a function of the thickness of an aluminum film.
Figure 8:
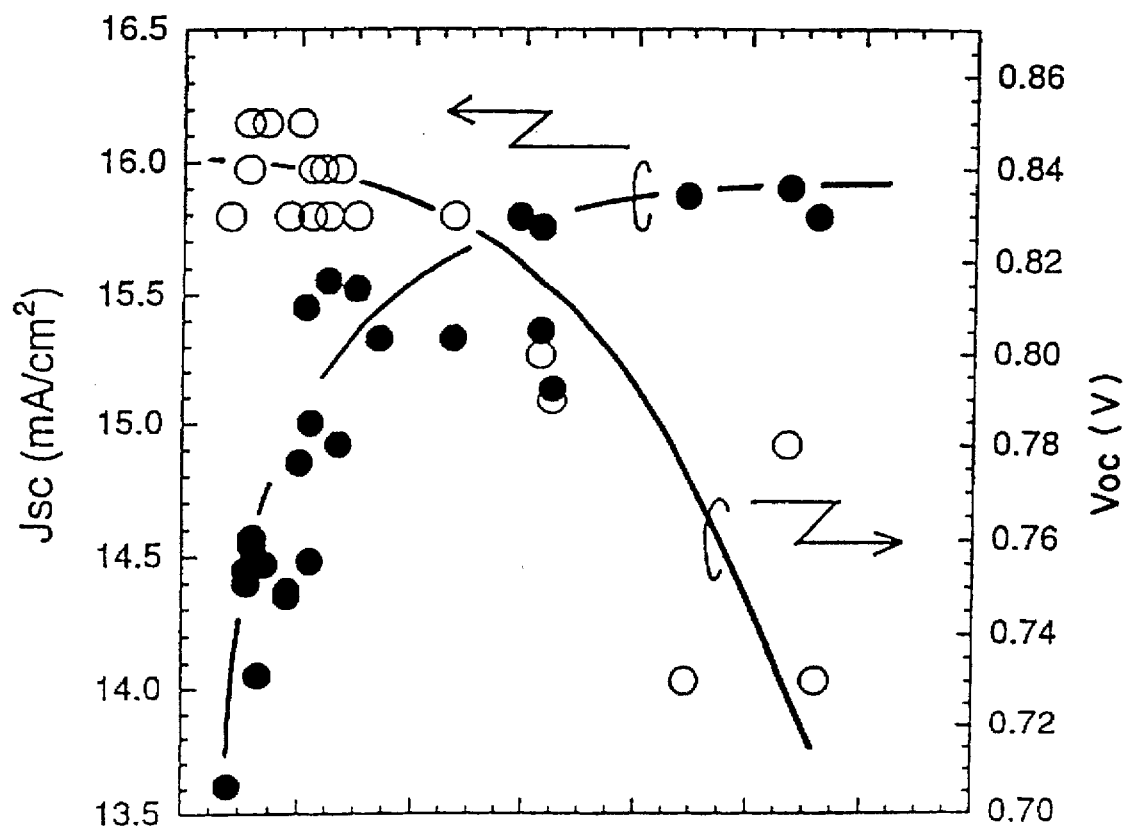
FIG. 8 shows the relation between size (average roughness of surface) of convex and concave shapes of the photoreflective electrode and photocurrent and open circuit voltage characteristics of the solar cell.

FIG. 7 shows a graph representing the diffuse reflectance (standard wavelength of incident light is 650 nm), with respect to film thickness of the aluminum film. From FIG. 7, in a range of 2000 Å 20000 Å, the diffuse reflectance is increased as film thickness of the aluminum film is increased.

A zinc oxide (ZnO) layer having a thickness of 100 to 3000 Å, about 800 Å in the embodiment, is formed over the aluminum layer 10 as a barrier layer 11 by sputtering (FIG. 2). Stainless steel having a thickness of 10 to 500 Å, e.g., 50 Å, may be used as the barrier layer 11. Also, titanium (Ti), chromium (Cr), or the like may be used.

Figure 15:
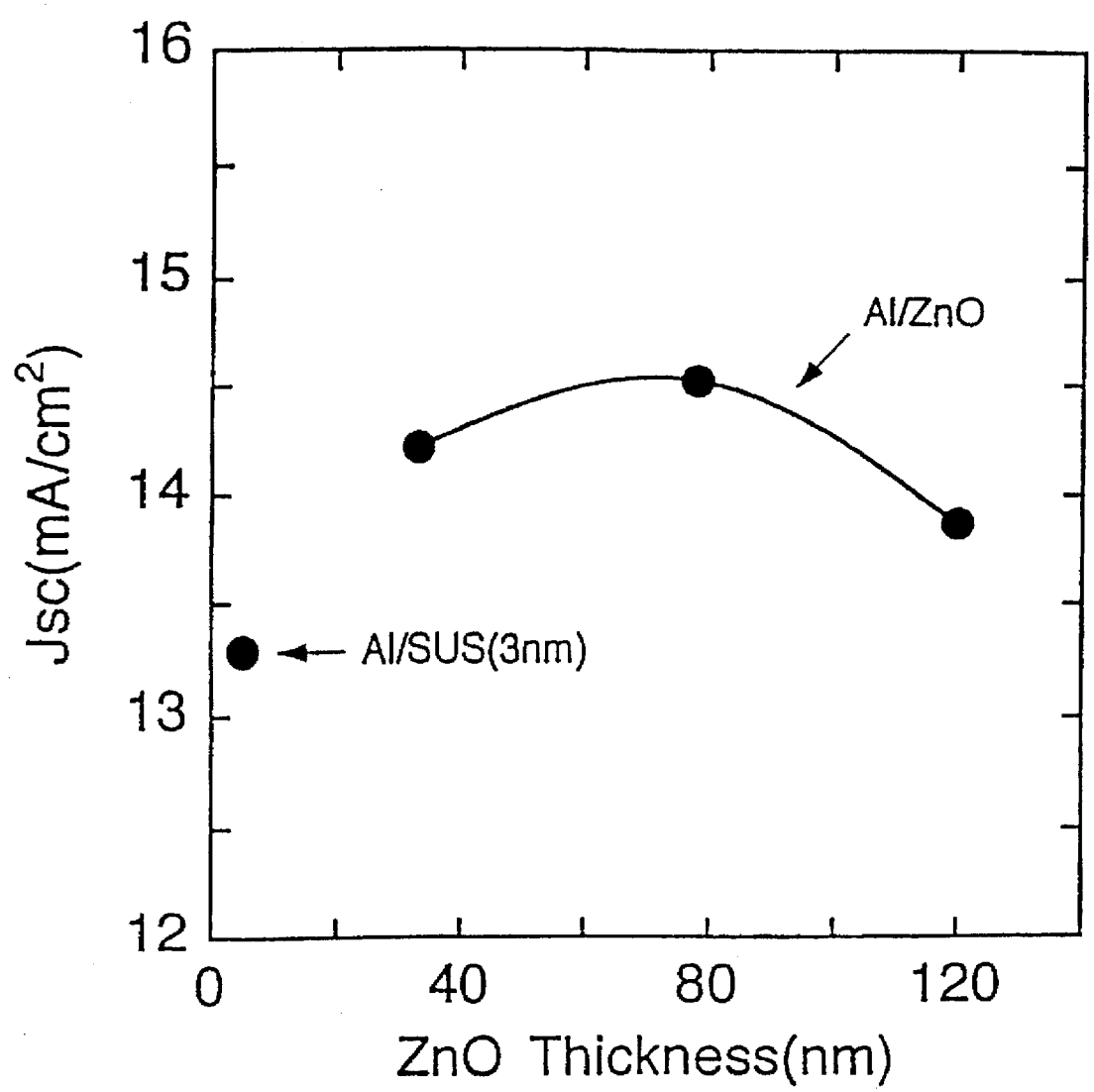
FIG. 15 shows a comparison of the short circuit current of solar cells wherein the barrier layer is zinc oxide and stainless steel.

FIG. 15 shows measurement results of short circuit current of a solar cell in a case wherein the barrier layer is zinc oxide (ZnO) and in a case wherein the barrier layer is stainless steel. From FIG. 15, it is seen to be advantageous to use zinc oxide (ZnO) as the barrier layer because it readily absorbs the long wavelength component of light.

A power generating layer 12 (FIG. 2) is then formed. An N-type layer having a thickness of 300 Å, an I-type layer having a thickness of 3000 Å, and a P-type layer having a thickness of 200 Å are sequentially formed from amorphous silicon films by plasma chemical vapor deposition (CVD). The N-type layer and the P-type layer may be a microcrystalline silicon thin film or an amorphous silicon thin film having microcrystals.

Then, an ITO (indium tin oxide) film having a thickness of 800 Å is formed as a transparent electrode 13 (FIG. 2) by sputtering. Current collecting electrodes are then formed by a printing method and processed to complete a solar cell.

The aluminum film of the embodiment having a texture structure is compared with a conventional aluminum film (wherein the substrate temperature is room temperature during sputtering and the target is 99.99% pure aluminum) having no texture structure. In both, a substrate on which the gas removal treatment is performed at 150° C. for 5 minutes is used.

Figure 3:
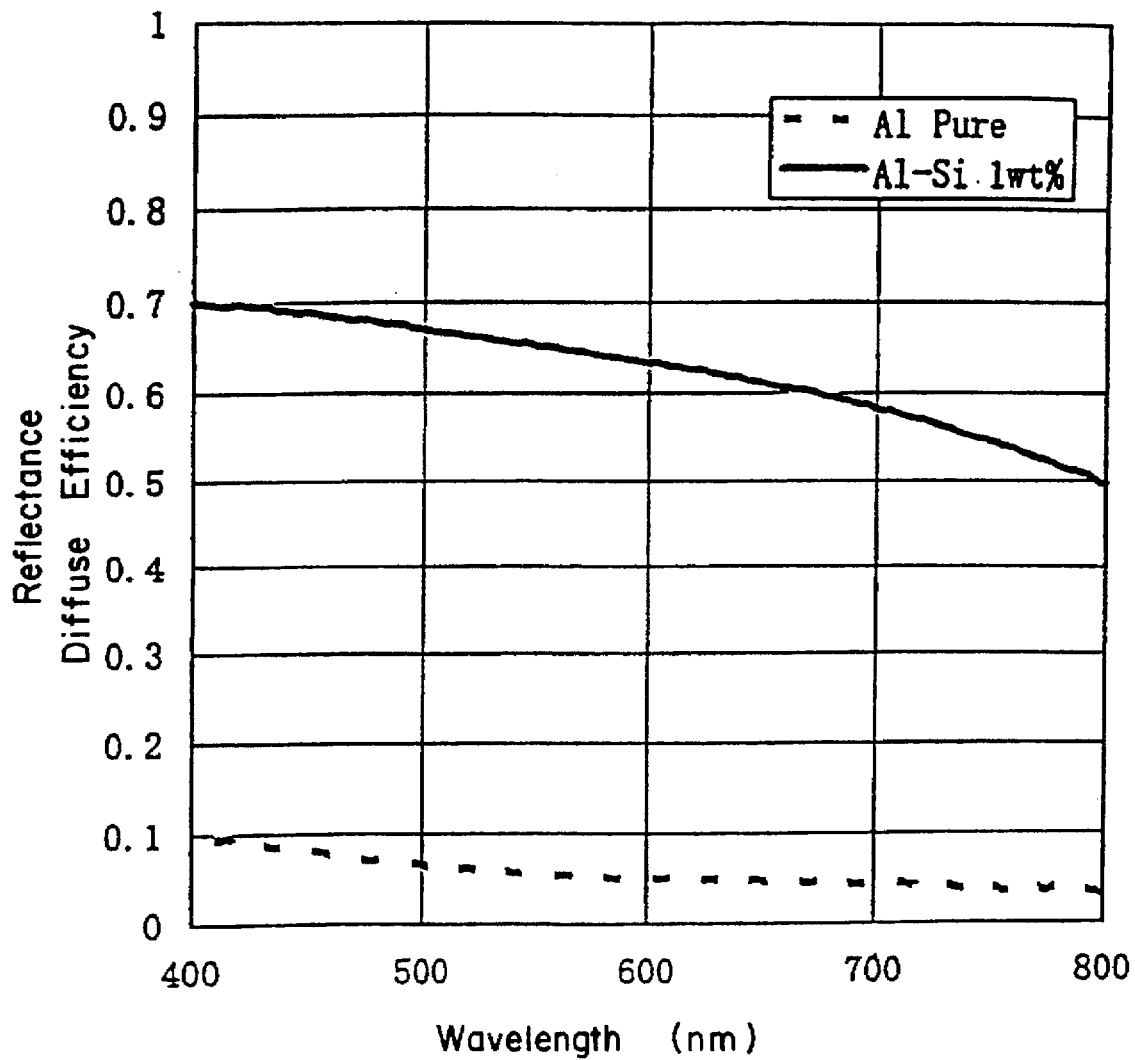
FIG. 3 shows a comparison of diffuse reflectances of the aluminum film of Embodiment 1 and a conventional aluminum film.
Figure 16:
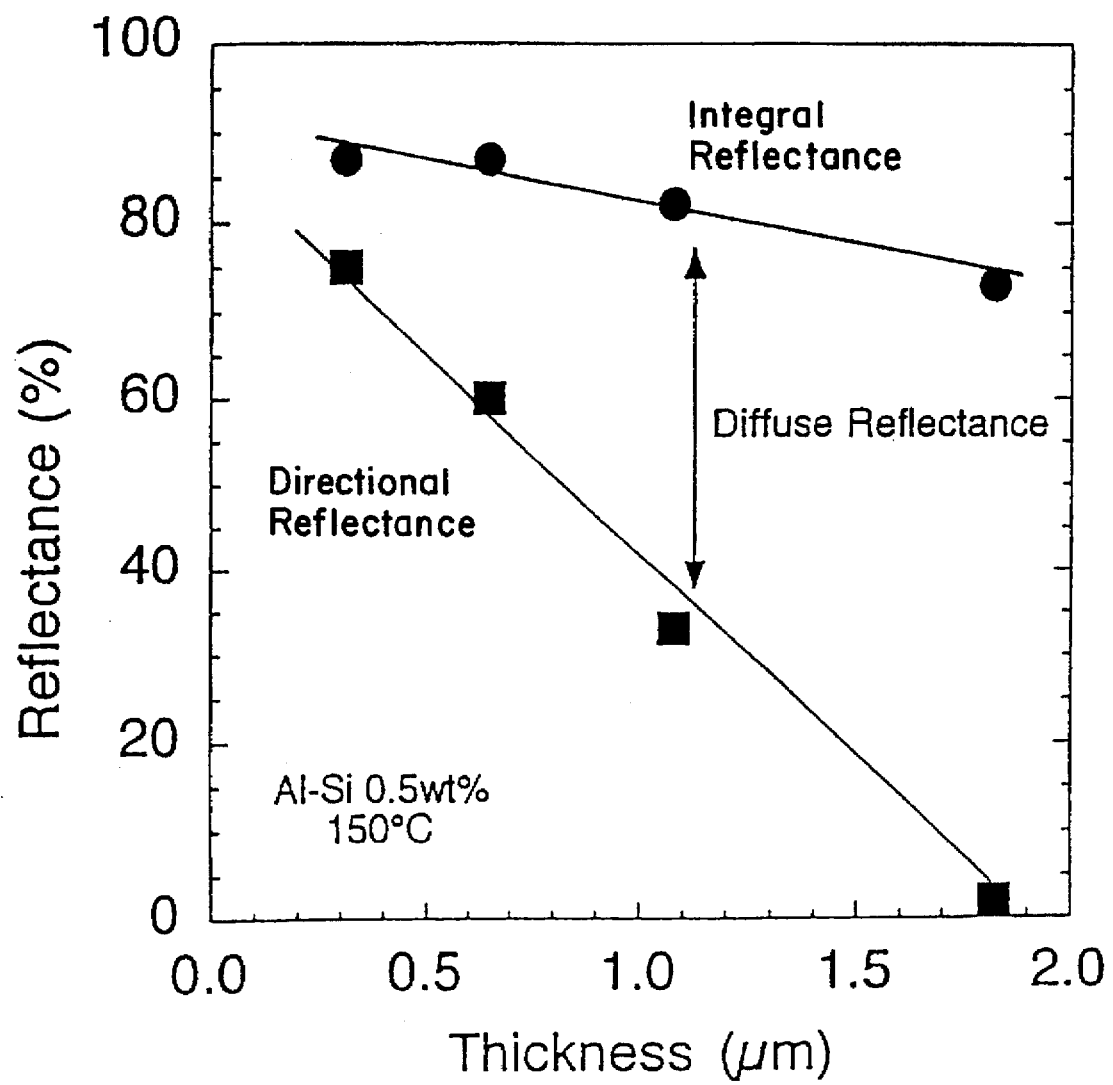
FIG. 16 is a view for explaining a diffuse reflectance.

FIG. 3 shows a comparison result of diffuse reflectances of the aluminum film of Embodiment 1 and the conventional aluminum film. The diffuse reflectance is a value obtained by subtracting the mirror or specular (directional) reflectance from the integrated reflectance (See FIG. 16). In FIG. 3, the diffuse reflectance of the aluminum film formed by the embodiment is significantly increased.

Figure 4:
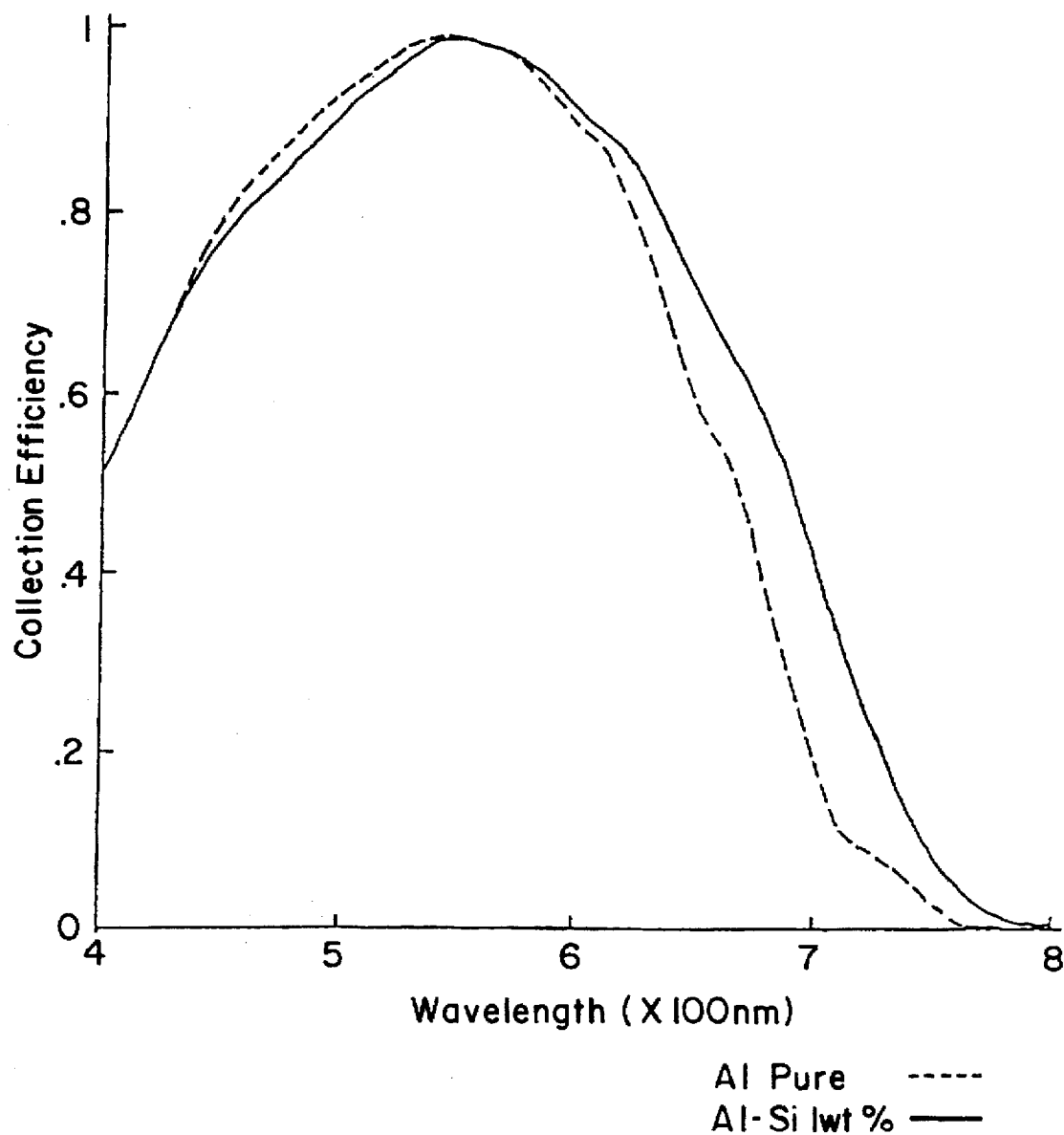
FIG. 4 shows collection efficiencies (for wavelength of incident light) of a solar cell in which the aluminum film of the embodiment is used as a photoreflective electrode and a solar cell in which a conventional aluminum film is used as the photoreflective electrode.
Figure 5:
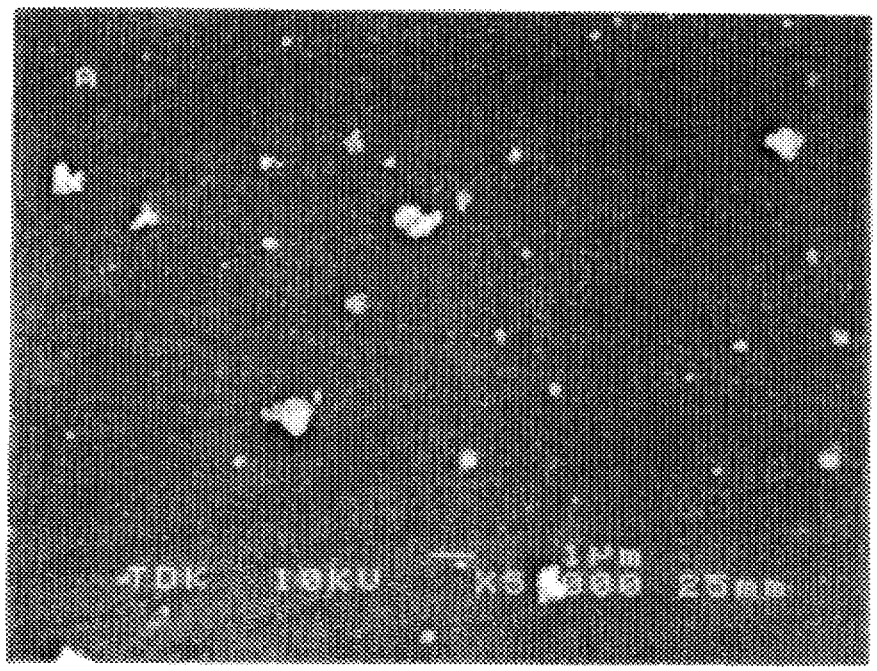
FIG. 5 shows a SEM photograph representing a state wherein large and abnormal crystal grains are generated in an aluminum film formed by a conventional method.

FIG. 4 shows collection efficiencies (for wavelength of incident light) of a solar cell in which the aluminum film of the embodiment is used as a photoreflective electrode and a solar cell in which the conventional aluminum film is used as a photoreflective electrode. From FIG. 4, it is seen that by forming the solar cell using the aluminum film of the embodiment as a photoreflective electrode, collection efficiency of the long wavelength component (about 500 to 800 nm) of incident light can be significantly improved.

Figure 19:
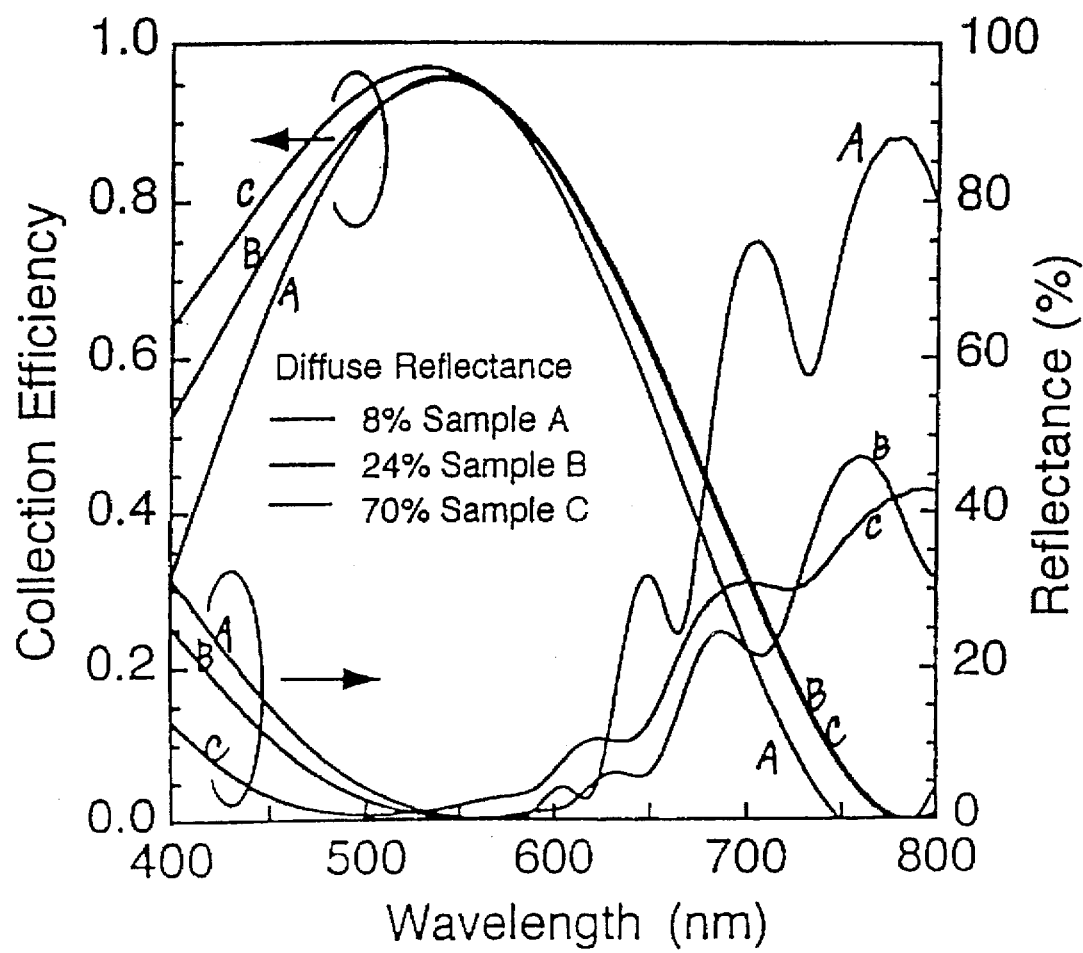
FIG. 19 shows collection efficiencies and reflectances of the solar cell of the present invention as a function of wavelength of incident light.

FIG. 19 shows, for the solar cell formed by using the aluminum film of the embodiment as a photoreflective electrode, collection efficiencies and reflectances of samples as a function of the wavelength of incident light in a case wherein the diffuse reflectance of the aluminum film is 8%, 24%, and 70%. From FIG. 19, it is seen that when the diffuse reflectance is large, the collection efficiency of the long wavelength component is large and the reflectance of the long wavelength component is small. A small reflectance represents an effective use of incident light because the quantity of light used for photoelectric conversion is large.

FIG. 20 shows a comparison of characteristics of the solar cell of the embodiment and the conventional solar cell. The area of the solar cells used in the comparison is 1 cm$^2$. In FIG. 20, although the open circuit voltage of the solar cell of the embodiment is decreased by about 1% in comparison with that of the conventional solar cell, the short circuit current of the solar cell of the embodiment is increased by about 11%. Thus, the photoelectric conversion efficiency can be improved by about 8%.

In the embodiment, when, without performing the gas removal treatment of the organic resin film substrate 5, the aluminum film in which silicon atoms are added as an impurity element at 1.0 weight % is formed by sputtering, a texture structure is obtained by growing crystal grains. However, film quality is deteriorated, and conductivity, photoreflectance, etc. are reduced in comparison with a case wherein the gas removal treatment is performed.

Embodiment 2

In this embodiment, a solar cell is produced by forming an aluminum film on a glass substrate by RF sputtering. The substrate is Corning 7059 glass. This substrate is placed in a chamber and then the chamber is exhausted to a vacuum of 7×10$^{-4}$ pa. The substrate temperature is 50° to 200° C., preferably 70° to 150° C., 150° C. in the embodiment.

Presputtering (precoating) is performed for 30 minutes. Main sputtering is performed for 10 minutes. The sputtering pressure is 0.5 pa. The sputtering gas is argon (Ar) and is introduced at 85 sccm. The sputtering power is 1.3 W/cm$^2$. The film forming rate is 300 Å/minute.

Thus, an aluminum film in which silicon atoms are added at 1.0 weight % is formed at a thickness of 3000 Å. The aluminum film has a fine texture structure, and the average grain size of the crystals constituting the convex portion is several 100 Å to several 1000 Å. A zinc oxide (ZnO) layer having a thickness of 100 to 3000 Å, about 800 Å in the embodiment, is formed thereover as a barrier layer by sputtering.

A power generating layer is then formed. An N-type layer having a thickness of 300 Å, an I-type layer having a thickness of 3000 Å, and a P-type layer having a thickness of 200 Å are formed by plasma CVD using amorphous silicon films. The N-type layer and the P-type layer may be a microcrystalline silicon thin film or an amorphous silicon thin film having microcrystals.

Then, an ITO film having a thickness of 800 Å is formed thereon as a transparent electrode by sputtering. Current collecting electrodes are formed by a printing method and then processed to complete a solar cell.

Thus, the solar cell is produced on a glass substrate by using an aluminum film having a texture structure formed by RF sputtering using a target of aluminum which silicon is added at 1.0 weight % as an impurity element. Since it effectively absorbs the long wavelength component of light in comparison with a conventional case wherein a smooth aluminum film is used as a photoreflective electrode, the photoelectric conversion efficiency can be significantly improved.

Embodiment 3

In this embodiment, an aluminum film having a texture structure and a silver film (for decreasing or blunting the convex and concave portions formed on the surface of the aluminum film) formed thereon are formed on a flexible organic resin film substrate to obtain a photoreflective electrode, and a thin film solar cell is produced by using the obtained photoreflective electrode.

Figure 9:
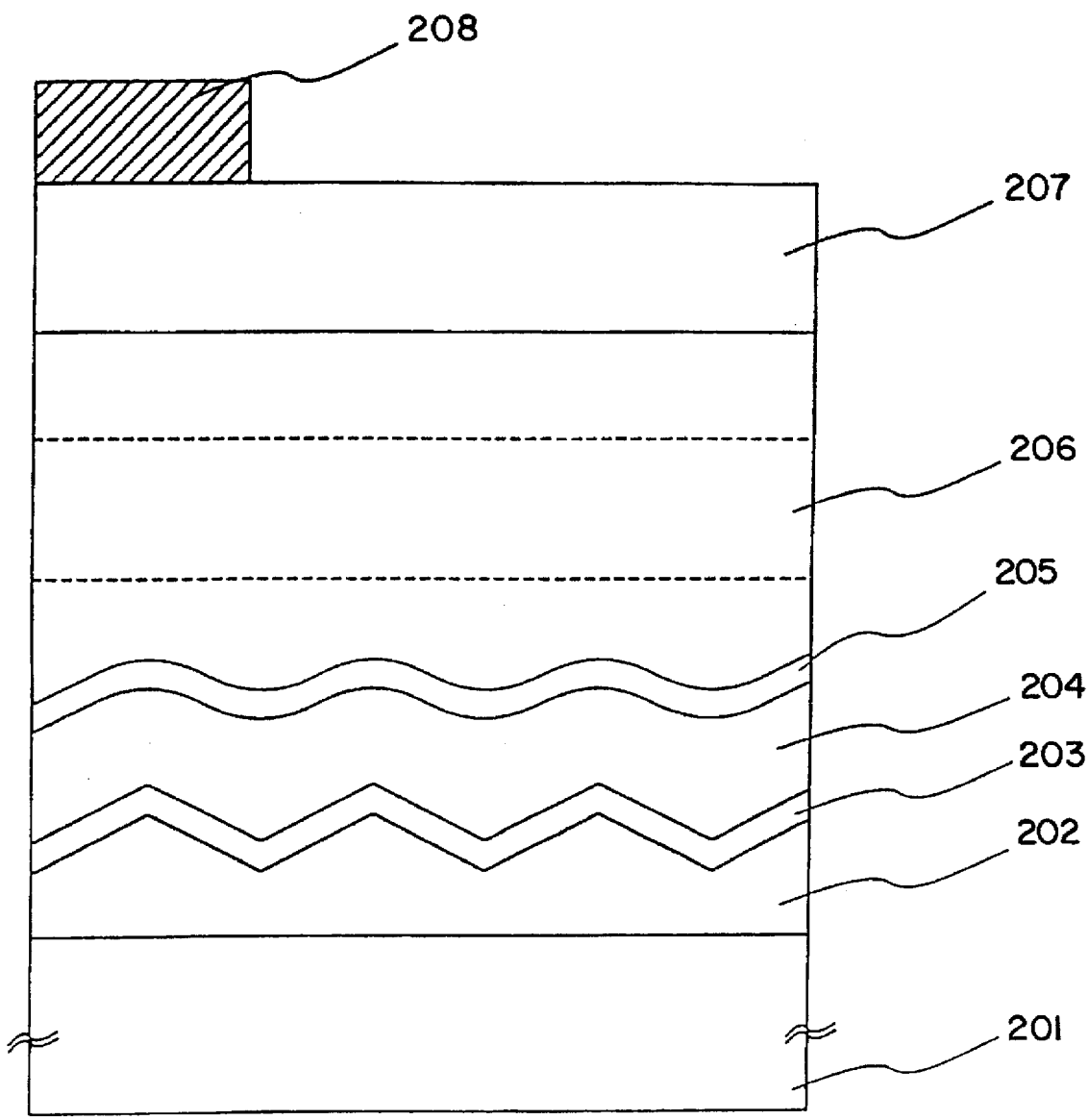
FIG. 9 shows the cross sectional structure of a solar cell of Embodiments 3 and 4.

FIG. 9 shows a cross sectional structure of the solar cell of Embodiment 3. This solar cell includes a substrate 201 made of an organic resin film, a photoreflective electrode, a photoelectric conversion layer 206 made of amorphous silicon, a transparent electrode 207 made of an ITO (indium tin oxide) alloy, and collector electrode 208 formed on the transparent electrode 207. The photoreflective electrode is a laminate of an aluminum film 202 which has convex and concave shapes and contains silicon atoms, a diffusion blocking layer 203 made of stainless steel, a silver layer 204, and a zinc oxide film 205. An aluminum film containing substantially no impurity element instead of the silver film 204 may be used.

The electrode used as a photoreflective electrode of a solar cell is formed by a roll-to-roll type magnetron DC (direct current) sputtering apparatus. The organic resin film substrate is a polyethylenenaphthalate (PEN) film substrate having a thickness of 75 μm. A polyethyleneterephthalate (PET), a polyestersulphone (PES), a polyimide, etc. can be also used as the organic resin film substrate.

Figure 10:
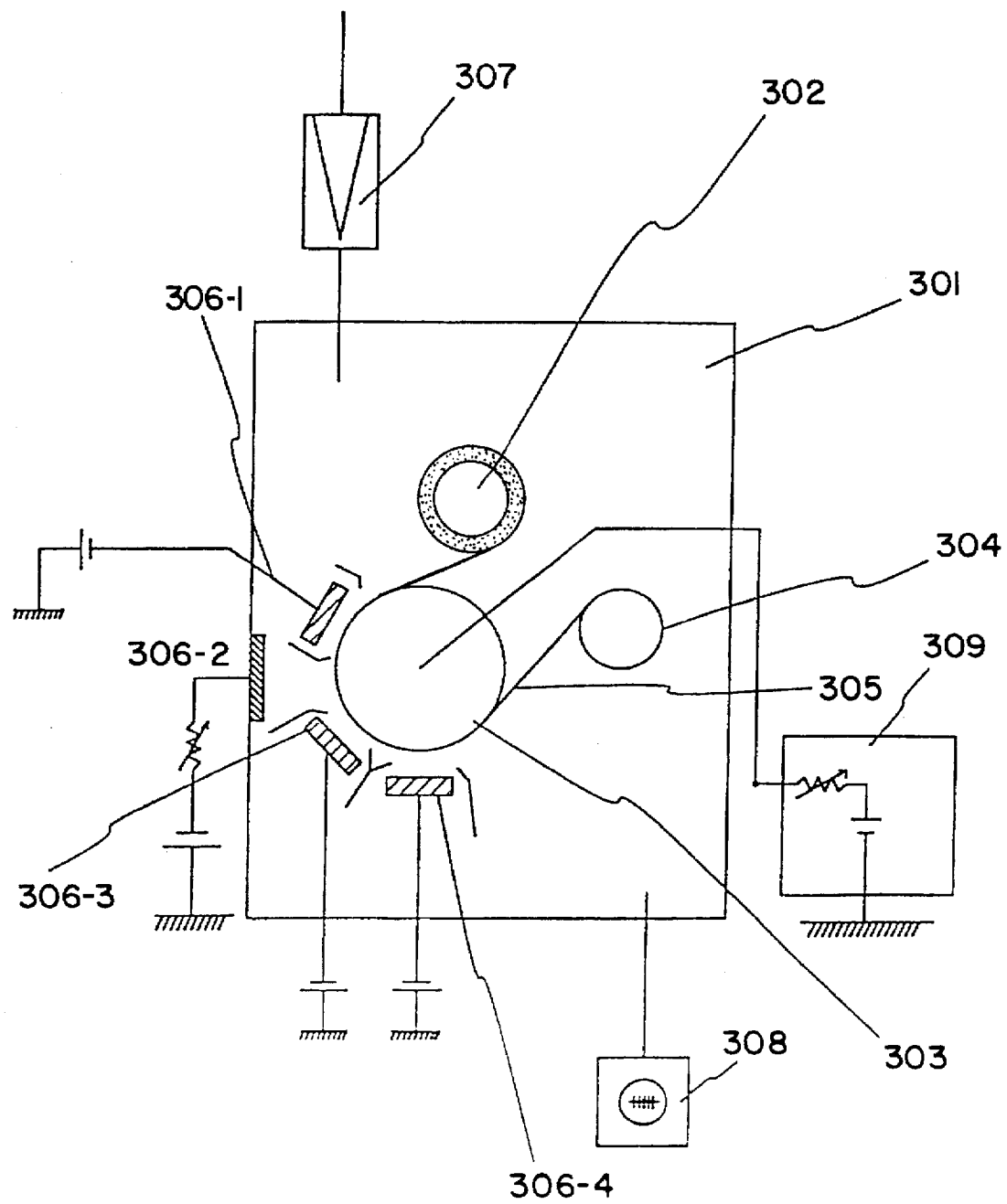
FIG. 10 shows a roll to roll type magnetron DC sputtering apparatus used in Embodiment 3.

FIG. 10 shows a roll to roll type magnetron DC sputtering apparatus used in Embodiment 3. A magnetron high frequency (radio frequency, RF) sputtering can be also performed. In FIG. 10, a PEN film which has a thickness of 50 to 150 μm, 75 μm in the embodiment, is used as a flexible organic resin film substrate 305 and is placed in a chamber 301 and mounted on supply roll 302 and take-up roll 304 over a drum 303, so that it is held in tension. The organic resin film substrate 305 is transferred by drive motors (not shown) provided in the supply roll 302, the drum 303 and the take-up roll 304.

Targets 306-1, 306-2, 306-3 and 306-4 are arranged along the substrate movement direction. The deposition speed is controlled by a slit provided between the target and the substrate and the discharge power supplied.

The target 306-1 is used to form an aluminum film having an uneven surface (convex and concave shapes on the surface) by using a target of alumina containing silicon atoms as an impurity element at 0.1 to 6.0 weight %, 1% in the embodiment. The target 306-2 is made of stainless steel and used to form a diffusion barrier layer that the aluminum film does not react with the silver film formed thereon. The target 306-3 is made of silver and used to form a film for decreasing or blunting the convex and concave shapes. Aluminum containing substantially no impurity element may be used instead of silver. The target 306-4 is made of zinc oxide and used to form a diffusion barrier layer so that the base film(s) do not react with silicon formed thereon.

The chamber 301 is exhausted by an exhaust system 308 such as a rotary pump and a cryopump to a vacuum of about $1 \times 10^{-3}$ pa. Before forming a film, gas removal treatment is performed to remove gases which are absorbed in the organic resin substrate film 305.

The temperature of the drum 303 is controlled by a heating apparatus 309, so that the organic resin film substrate 305 can be heated by contact of the moving substrate 305 with the rotation of the drum 3. The substrate temperature in the gas removal treatment is 130° to 200° C., preferably 140° to 180° C., 150° C. in the embodiment. The speed of movement of the substrate is controlled so as to maintain the above substrate temperature of the organic resin film substrate 305 for few minutes, preferably 5 minutes or longer, so that gas removal treatment is performed for an entire roll-like film substrate.

After the gas removal treatment of the organic resin film substrate 305, the chamber 301 is exhausted again to a vacuum of about $1 \times 10^{-5}$ Pa. After the vacuum exhaust, pure argon gas is introduced from a gas supplying system 307 into the chamber 301 at 100 SCCM. The chamber 301 is maintained at a pressure of 0.5 Pa by a pressure regulating unit provided in the exhaust system 308.

Then, glow discharge is produced by supplying a direct current power to the target, to initiate film formation by sputtering. Presputtering (precoating) is performed to remove contamination of the surface of the target. In the embodiment, presputtering is performed for 30 minutes while moving the organic resin film substrate 305. The temperature of the organic resin film substrate 305 is controlled so as to be maintained at 50° to 200° C., 150° C. in the embodiment, by the heating apparatus 309 connected to the drum 303.

After the presputtering, main sputtering is performed. The thickness of the film deposited on the organic resin film substrate can be regulated by regulating the direct current power and movement speed of the film substrate.

In the embodiment, since films having different film formation rates are laminated continuously, the film thickness of each layer is controlled by regulating the direct current power supplied to the target while the movement speed of the film substrate is constant. The film formation rate of an aluminum film can be set to be 70 to 700 nm/minute, 200 nm/minute in the embodiment, so that a film having a thickness of 1000 nm is formed. The content of the impurity element in the formed aluminum film is 0.5% (by the Auger electron spectroscopy method).

Figure 17:
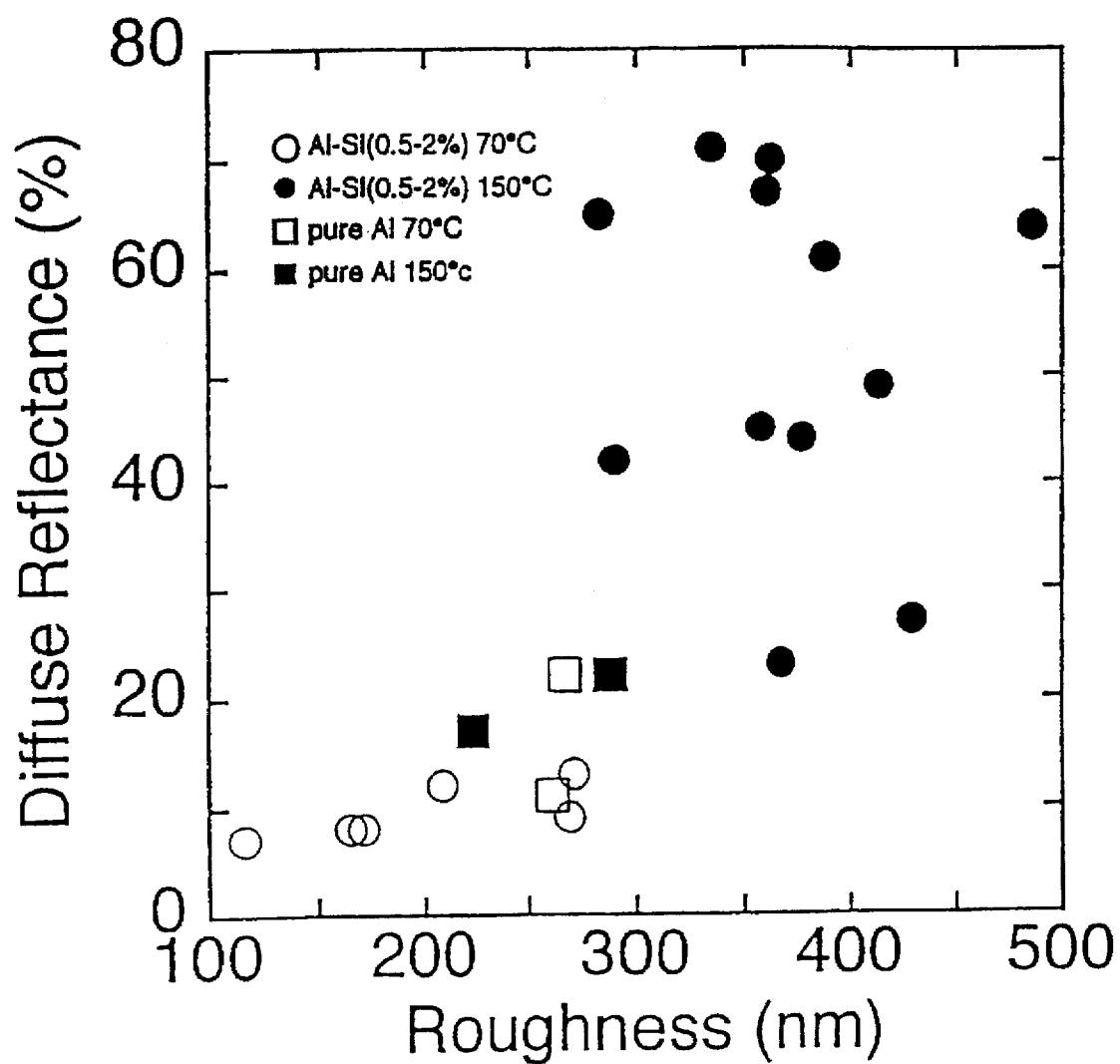
FIG. 17 shows the relationship between average roughness of the surface and diffuse reflectance.

The average roughness of the surface of the aluminum film is 90 nm (measure by JIS B0601 Rz (10 point average roughness)). FIG. 17 shows the relationship between average roughness of the surface and diffuse reflectance. The average roughness is measured by the above 10 point average roughness. In FIG. 17, the diffuse reflectance is increased as the average roughness is increased.

The film formation rate of the stainless steel film can be set to be 1 to 100 nm/minute, 2 nm/minute in the embodiment, so that a film having a thickness of 10 nm is formed. The film formation rate of the silver film can be set to be 10 to 500 nm/minute, 10 nm/minute in the embodiment, so that a film having a thickness of 100 nm is formed.

When aluminum containing substantially no impurity element is used instead of silver, the film formation rate thereof is 20 to 500 nm/minute, e.g., 20 nm/minute, so that a film having a thickness of 100 nm is formed.

The film formation speed of the zinc oxide film can be set to be 30 to 250 nm/minute, 160 nm/minute in the embodiment, so that a film having a thickness of 80 nm is formed.

Figure 18:
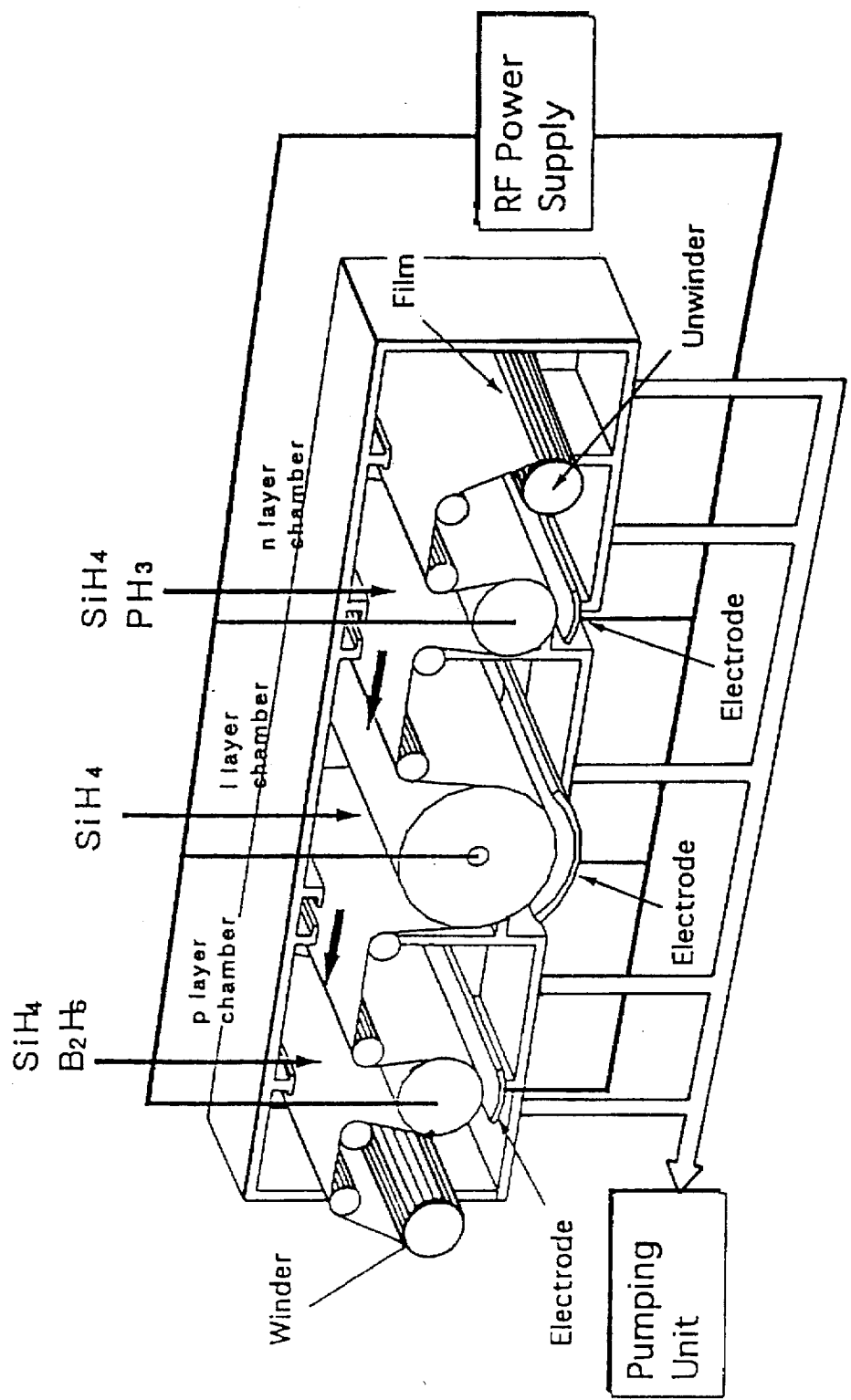
FIG. 18 shows a plasma CVD apparatus.

A photoelectric conversion layer is then formed thereon. An N-type layer having a thickness of 300 Å, a substantially intrinsic I-type layer having a thickness of 5000 Å, and a P-type layer having a thickness of 200 Å are formed in order from amorphous silicon layer(s) by plasma CVD using the apparatus of FIG. 18. The N-type layer and the P-type layer may be a microcrystalline silicon thin film or an amorphous silicon thin film having microcrystals.

After the photoelectric conversion film is formed, an indium tin oxide (ITO) alloy film having a thickness of 800 Å is formed thereon as a transparent electrode by sputtering. The sheet resistance of the ITO film is 100 to 1000 Ω/square and thus the ITO film has a high resistance as an electrode of a solar cell, so that a grid-like electrode made of silver is formed as an auxiliary electrode on the ITO film.

Output electrodes are formed on the photoreflective electrode side and the transparent electrode side and processed to complete a solar cell.

Figure 11:
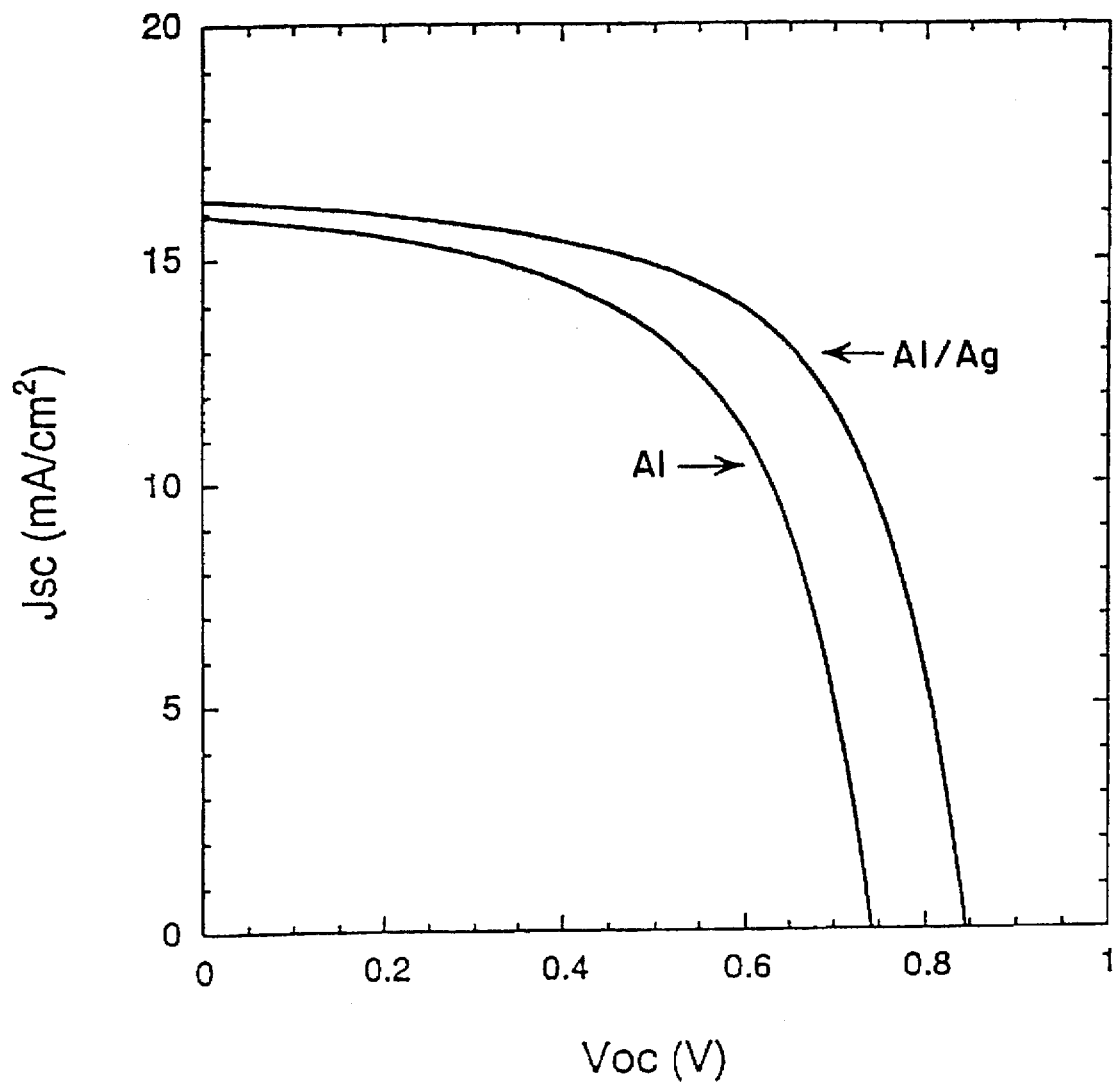
FIG. 11 shows a comparison of the characteristics of the solar cell of Embodiment 3 and a conventional solar cell.
Figure 12:
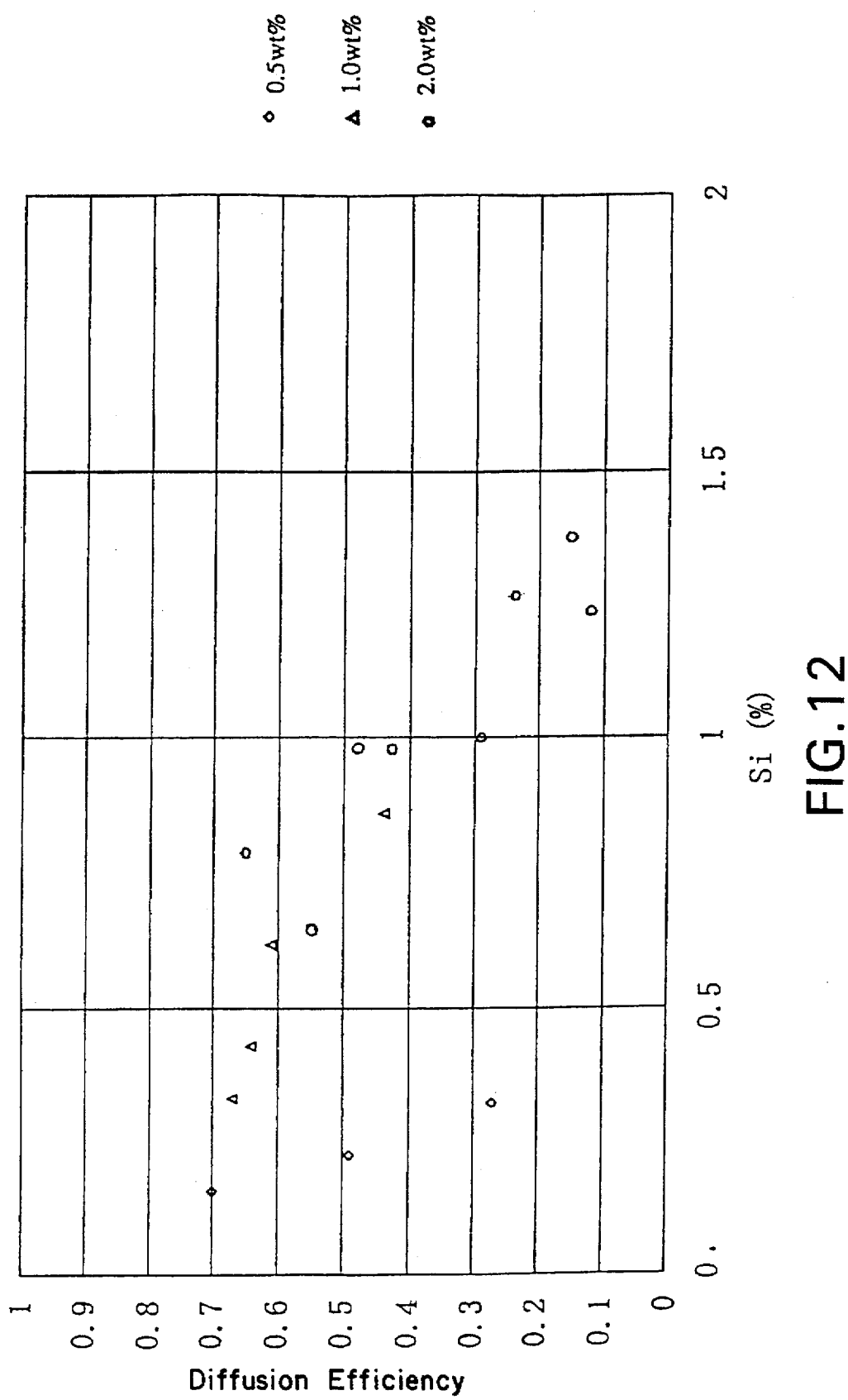
FIG. 12 shows the relationship between the content of silicon as an impurity element in the aluminum film and the diffuse reflectance of the aluminum film.

FIG. 11 shows a comparison of current-voltage characteristics of the solar cell of Embodiment 3 and a conventional solar cell produced by using an aluminum film having convex and concave shapes. As shown in FIG. 11, in the solar cell of Embodiment 3, the short circuit current is increased by about 0.3 mA and thus is 16.3 mA, and the open circuit voltage is increased by 0.1 V and thus is 0.84 V in comparison with the conventional solar cell. The open circuit voltage value is the same as when a flat substrate not having convex and concave shapes is used.

This result may be obtained by forming a two layer structure of an aluminum film (which has convex and concave shapes and contains silicon atoms) and an overlying silver film (which has a function of decreasing or blunting the convex and concave shapes) as a photoreflective electrode.

In the solar cell of Embodiment 3 produced by using the photoreflective electrode which has the convex and concave shapes and on which the aluminum film containing silicon atoms as an impurity element and a silver layer formed thereon are laminated, the photoelectric conversion efficiency can be significantly improved in comparison with a conventional solar cell produced by using a photoreflective electrode having no convex and concave shapes and a conventional solar cell produced by using a photoreflective electrode having convex and concave shapes.

When an aluminum film containing substantially no impurity element instead of a silver film is used, convex and concave shapes of the aluminum film having an uneven surface can be decreased (blunted) and the open circuit voltage can be improved similar to when the silver film is used. However, since the photoreflectance of aluminum is lower than that of silver, the short circuit current is decreased to some extent. Thus the conversion efficiency of a solar cell is reduced to some extent in comparison with the case wherein silver is used.

Embodiment 4

In this embodiment, a solar cell is produced by forming a photoreflective electrode on a glass substrate by DC magnetron sputtering. The solar cell has the same structure as shown in FIG. 9. The substrate is Corning 7059 glass. The sputtering apparatus is standard, and a photoreflective electrode is formed by periodically changing the target. Also, the necessary targets are arranged in a reactive chamber and substrates are transferred in turn and processed, so that films can be formed continuously.

A photoreflective electrode is formed by the following process. A glass substrate and a target of aluminum in which silicon atoms are added as an impurity element at 0.1 to 6.0 weight %, 1% in the embodiment are placed in the vacuum chamber of a sputtering apparatus, and the chamber is exhausted until a vacuum of $7 \times 10^{-4}$ Pa is reached. The substrate temperature is 50° to 200° C., preferably 70° to 150° C., 150° C. in the embodiment.

Presputtering (precoating) is performed for 30 minutes. Then, main sputtering for forming a film on the substrate is performed. In the main sputtering, the sputtering gas is argon (Ar) supplied into the chamber at 85 SCCM, so that the pressure in the chamber is maintained at 0.5 Pa.

When direct current power of 800 W is applied to the target, a film formation rate of 100 nm/minute is obtained. Thus, after film formation for 10 minutes, an aluminum film which has a thickness of 1000 nm and contains silicon atoms is formed. The formed aluminum film has convex and concave shapes on the surface thereof.

After the target is changed, in the same manner, a stainless steel film having a thickness of 1 to 20 nm, 10 nm in the embodiment, a silver film having a thickness of 10 to 200 nm, 100 nm in the embodiment and a zinc oxide film having a thickness of 10 to 300 nm, 80 nm in the embodiment, are laminated in this order.

To form a photoelectric conversion layer, an N-type layer having a thickness of 30 nm, an I-type layer having a thickness of 500 nm, and a P-type layer having a thickness of 20 nm are formed by plasma CVD using amorphous silicon films. The N-type layer and the P-type layer may be a microcrystalline silicon thin film or an amorphous silicon thin film having microcrystals.

An indium tin oxide (ITO) alloy film having a thickness of 80 nm is formed thereon as a transparent electrode by sputtering. The sheet resistance of the ITO film is 100 to 1000 Ω/square and thus the ITO film has a high resistance as an electrode of a solar cell, so that a grid-like electrode made of silver is formed on the ITO film as an auxiliary electrode.

Output electrodes are formed on the photoreflective electrode and the transparent electrode and processed to complete a solar cell.

In the solar cell of Embodiment 4 formed on the glass substrate, the open circuit voltage is increased and the conversion efficiency can be improved in comparison with a conventional solar cell in which a silver film is not formed on an aluminum film having an uneven surface.

As described above, by the present invention, an aluminum film having a fine texture structure which is superior as a photoreflective electrode of a solar cell can be formed. In the solar cell using the aluminum film having the free texture structure as the photoreflective electrode, the photoelectric conversion efficiency can be significantly improved in comparison with the case wherein a conventional flat aluminum film is used.

Also, since abnormal and large growth of the crystals can be prevented, occurrence of short circuits between the transparent electrode and the photoreflective electrode of the solar cell can be prevented.

Further, by forming a silver or aluminum film on the aluminum film having a texture structure, a photoreflective electrode of a solar cell which has a fine texture structure and not having sharp convex and concave shapes can be obtained in comparison with a case wherein an aluminum film constituting a photoreflective electrode has simply convex and concave shapes. In the solar cell using the photoreflective electrode, the open circuit voltage is increased and thus the photoreflective conversion efficiency can be improved largely in comparison with a conventional solar cell using a photoreflective electrode having convex and concave shapes.

Furthermore, when an organic resin film substrate is used, an aluminum film having a fine and uniform texture structure can be obtained. By using the aluminum film as a photoreflective electrode, the photoelectric conversion efficiency of a solar cell on an organic resin film substrate can be significantly improved.

What is claimed is:

1. A solar cell comprising:
   a substrate;
   a photoreflective electrode formed on the substrate;

a photoelectric conversion layer formed on the electrode; and a transparent electrode formed on the layer, wherein the photoreflective electrode has a first aluminum film containing at least one of silicon, nickel, and copper at 0.1 to 6.0 weight % and a second aluminum film formed on the first aluminum film and containing substantially no impurity element.

2. The solar cell of claim 1 wherein the impurity element is silicon.

3. The solar cell of claim 1 wherein the substrate includes an organic resin film.

4. The solar cell of claim 3 wherein the organic resin film is constituted by one of polyethyleneterephthalate, polyethylenenaphthalate, polyestersulphone, polyimide, and aramid.

5. A solar cell comprising:

a substrate;

a photoreflective electrode formed on the substrate;

a photoelectric conversion layer formed on the electrode; and a transparent electrode formed on the layer, wherein the photoreflective electrode has a first aluminum film containing at least one of silicon, nickel, and copper as an impurity element at 0.1 to 6.0% and a second aluminum film formed on the first aluminum film and containing substantially no impurity element, and wherein the first aluminum film has an average roughness of a surface thereof of 50 nm or more.

6. The solar cell of claim 5 wherein the impurity element is silicon.

7. The solar cell of claim 5 wherein the substrate includes an organic resin film.

8. The solar cell of claim 7 wherein the organic resin film is constituted by one of polyethyleneterephthalate, polyethylenenaphthalate, polyestersulphone, polyimide, and aramid.

* * * * *